(12) United States Patent
Mule' et al.

(10) Patent No.: US 7,554,347 B2
(45) Date of Patent: Jun. 30, 2009

(54) HIGH INPUT/OUTPUT DENSITY OPTOELECTRONIC PROBE CARD FOR WAFER-LEVEL TEST OF ELECTRICAL AND OPTICAL INTERCONNECT COMPONENTS, METHODS OF FABRICATION, AND METHODS OF USE

(75) Inventors: Tony Mule', Atlanta, GA (US); Hiren Thacker, Decatur, GA (US); Muhannad Bakir, Atlanta, GA (US); James D. Meindl, Marietta, GA (US); Thomas K. Gaylord, Atlanta, GA (US); Kevin P. Martin, Atlanta, GA (US); Paul Kohl, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 83 days.

(21) Appl. No.: 10/390,873

(22) Filed: Mar. 17, 2003

(65) Prior Publication Data

US 2004/0017215 A1      Jan. 29, 2004

Related U.S. Application Data

(60) Provisional application No. 60/365,443, filed on Mar. 19, 2002.

(51) Int. Cl.
    *G01R 31/02* (2006.01)
(52) U.S. Cl. ..................................... 324/754
(58) Field of Classification Search ................. 324/209, 324/218, 307, 96, 244.1, 260, 750–755
    See application file for complete search history.

(56) References Cited

U.S. PATENT DOCUMENTS

| | | | |
|---|---|---|---|
| 4,786,876 A | 11/1988 | Graham | ..................... 324/551 |
| 5,124,931 A | 6/1992 | Iwamatsu et al. | ........... 364/489 |
| 5,187,431 A | 2/1993 | Libretti | ....................... 324/158 |
| 5,254,939 A | 10/1993 | Anderson et al. | ........... 324/158 |
| 5,363,038 A | 11/1994 | Love | .......................... 324/158 |
| 5,428,298 A | 6/1995 | Ko | .............................. 324/762 |
| 5,432,878 A | 7/1995 | Smous | ........................ 385/52 |
| 5,477,168 A | 12/1995 | Thijssen et al. | ............... 326/46 |
| 5,493,236 A | 2/1996 | Ishii et al. | .................... 324/752 |
| 5,506,498 A | 4/1996 | Anderson et al. | ........... 324/158 |
| 5,606,410 A * | 2/1997 | Peclier et al. | ............ 356/237.2 |
| 5,656,942 A | 8/1997 | Watts et al. | .................. 324/754 |
| 5,691,651 A | 11/1997 | Ehlermann | .................. 324/760 |
| 5,701,309 A | 12/1997 | Gearhardt et al. | .......... 371/25.1 |
| 5,773,951 A | 6/1998 | Markowski et al. | ......... 318/625 |

(Continued)

OTHER PUBLICATIONS

Chen, et al., Fully Embedded Board-Level Guided-Wave Optoelectronic Interconnects; Jun. 2000; Proceedings of the IEEE, vol. 88, No. 6, pp. 780-793.

(Continued)

*Primary Examiner*—Jermele M Hollington
*Assistant Examiner*—Trung Q Nguyen
(74) *Attorney, Agent, or Firm*—Thomas, Kayden, Horstemeyer & Risley, LLP (57) ABSTRACT

Optoelectronic probe cards, methods of fabrication, and methods of use, are disclosed. Briefly described, one exemplary embodiment includes an optoelectronic probe card adapted to test an electrical quality and an optical quality of an optoelectronic structure under test having electrical and optical components.

28 Claims, 4 Drawing Sheets

U.S. PATENT DOCUMENTS

| | | |
|---|---|---|
| 5,914,684 A | 6/1999 | Brettner, III ............... 342/175 |
| 5,929,646 A | 7/1999 | Patel et al. ................. 324/754 |
| 6,292,003 B1 | 9/2001 | Fredrickson et al. ........ 324/754 |
| 6,292,005 B1 | 9/2001 | Suga ......................... 324/754 |
| 6,297,658 B1 | 10/2001 | Nakata et al. ............... 324/765 |
| 6,300,786 B1 | 10/2001 | Doherty et al. ............. 324/765 |
| 6,307,392 B1 | 10/2001 | Soejima et al. ............. 324/762 |
| 6,323,663 B1 | 11/2001 | Nakata et al. ............... 324/754 |
| 6,333,635 B1 | 12/2001 | Lee et al. .................... 324/754 |
| 6,340,895 B1 | 1/2002 | Uher et al. .................. 324/755 |
| 6,344,754 B1 | 2/2002 | Tamai ......................... 324/765 |
| 6,348,810 B1 | 2/2002 | Yanagawa et al. ........... 324/765 |
| 6,375,347 B1 * | 4/2002 | Bruce et al. .................... 374/5 |
| 6,747,464 B1 * | 6/2004 | Blackwood ................. 324/752 |
| 6,785,458 B2 * | 8/2004 | Mule'et al. .................. 385/131 |
| 6,800,424 B2 * | 10/2004 | Xu et al. ...................... 430/321 |
| 6,850,052 B2 * | 2/2005 | Iino et al. ................. 324/158.1 |
| 7,038,288 B2 * | 5/2006 | Lai et al. ..................... 257/448 |
| 2003/0025495 A1 * | 2/2003 | Ilno et al. ................. 324/158.1 |

OTHER PUBLICATIONS

Naeemi, et al., Sea of Leads: A Disruptive Paradigm for a System-on-a-Schip (SoC); 2001; Digest of Technical Papers; pp. 280-281.

Lionel C. Kimerling; Silicon Microphotonics; 2000; Applied Surface Science; pp. 8-13.

* cited by examiner

HIGH INPUT/OUTPUT DENSITY OPTOELECTRONIC PROBE CARD FOR WAFER-LEVEL TEST OF ELECTRICAL AND OPTICAL INTERCONNECT COMPONENTS, METHODS OF FABRICATION, AND METHODS OF USE

CROSS-REFERENCE TO RELATED APPLICATION

This application claims priority to U.S. provisional application entitled, "HIGH-INPUT/OUTPUT-DENSITY OPTOELECTRONIC PROBE CARD FOR WAFER-LEVEL TEST OF ELECTRICAL AND OPTICAL INTERCONNECT COMPONENTS AND METHODS OF FABRICATION," having Ser. No. 60/365,443, filed Mar. 19, 2002, which is entirely incorporated herein by reference.

STATEMENT REGARDING FEDERALLY SPONSORED RESEARCH OR DEVELOPMENT

The U.S. government may have a paid-up license in this invention and the right in limited circumstances to require the patent owner to license others on reasonable terms as provided for by the terms of MDA 972-99-1-0002 awarded by the DARPA of the U.S. Government.

TECHNICAL FIELD

The present invention is generally related to probe cards and, more particularly, embodiments of the present invention are related to probe cards for wafer-level testing of electrical and optical interconnect components, methods of fabricating probe cards, and methods of using probe cards.

BACKGROUND OF THE INVENTION

Wafer-level batch packaging is under investigation by researchers to address the high power, input/output (I/O) density, and I/O bandwidth requirements of future technology generations (Naeemi, et al., Proc. *IEEE International Solid State Circuits Conference*, San Francisco, Calif., 280-281 (February 2001); International Technology Roadmap for Semiconductors (ITRS) (2001 update)). An optical interconnect technology conducive to wafer-level packaging is guided-wave optical interconnection. Optical waveguide interconnection allows for planar packaging of a hybrid electrical/optical system in a manner conducive to the delivery of future heat removal and power supply requirements. In addition, polymer waveguide technologies offer immediate, low-cost compatibility with wafer-level fabrication processes (Mule', et al., Procs. *IEEE International Interconnect Technology Conference*, San Francisco, Calif., 122-124 (June 2002)).

Integration of optical interconnection into microelectronic systems usually requires high-volume testability of optical interconnect components. Introductory technologies will likely involve the use of off-chip optical sources for intra-chip and inter-chip optical clock distribution and inter-chip and fiber-to-the-chip data communication. In each of these cases, chip-level detectors, waveguides, and diffractive optic devices will be integrated with CMOS microelectronics that require optical excitation in a manner representative of that found within a finished product. To provide for timely, low-cost, and high-volume testability, simultaneous electrical contact is made with chip-level I/O to provide for standard electrical testing. Finally, the density of electrical test I/O should match that of the chip under test, resulting in the need for an optoelectronic probe card capable of ultra-high-density electrical I/O. Thus, a heretofore unaddressed need exists in the microelectronics industry for a probe card that addresses the aforementioned deficiencies and/or inadequacies.

SUMMARY OF THE INVENTION

Optoelectronic probe cards, methods of fabrication, and methods of use, are disclosed. Briefly described, one exemplary embodiment includes an optoelectronic probe card adapted to test an electrical quality and an optical quality of an optoelectronic structure having electrical components and optical interconnect components.

The present invention also involves methods of fabricating optoelectronic probe cards. Briefly described, one exemplary method includes forming a waveguide that is located within the probe card. Another embodiment of the method includes forming a waveguide that is within the probe card, wherein a portion of the waveguide is surrounded by an air-gap cladding layer.

The present invention also involves methods for testing an optoelectronic structure having electrical and optical interconnect components with optoelectronic probe cards. Briefly described, one exemplary method includes producing an optical signal in an optoelectronic probe card and coupling an optical signal from the optoelectronic probe card to an optoelectronic structure under test. Another embodiment of the method includes producing an optical signal in an optoelectronic structure under test and coupling an optical signal from the optoelectronic structure to an optoelectronic probe card.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 1B is a cross-sectional view of optoelectronic probe card FIG. 1A in the A-A direction, as shown by the arrows in FIG. 1A.

FIG. 3B is a cross-sectional view of the optoelectronic probe card FIG. 3A in the A-A direction, as shown by the arrows in FIG. 3A.

DETAILED DESCRIPTION

In general, optoelectronic probe cards of the present invention are capable of wafer-level or board-level testing of active optical components and/or passive optical components as well as high-density electrical components in hybrid optoelectronic/microelectronic chips and printed wiring/waveguide boards or substrates (e.g., chips, boards, and substrates having both optical and electronic components). The optoelectronic probe cards use high-density wafer-level packaging technology in conjunction with active and passive optical interconnect technologies to test optoelectronic chips. The optoelectronic probe cards include embedded waveguides (e.g., optical dielectric or photonic crystal waveguides), which facilitate testing of compact hybrid optoelectronic chips.

In addition, these optoelectronic probe cards can include waveguides having either a dielectric or air-gap cladding engaging (e.g., surrounding the waveguide core of the waveguide) a portion of the waveguide core. The presence of an air-gap cladding allows for a maximization in refractive index contrast between waveguide core and cladding regions, which in turn permits tighter bends and increased waveguide density through enhanced confinement of optical power within the waveguide core region.

Further, these optoelectronic probe cards can include a waveguide having a coupling element disposed within and/or adjacent to the waveguide core in order to couple optical power both into and out of waveguide regions. The coupling element can be in the form of a grating coupler, total internal reflection mirror, or evanescent coupler, for example.

Also, these optoelectronic devices, such as emitters or detectors, could be situated within the optoelectronic probe card through hybrid, monolithic, or polylithic means, or adjacent to the optoelectronic probe card such that butt-coupling of optical power into and out of the waveguide core region(s) is allowed (thus negating the specific need for a coupling structure to be incorporated).

Furthermore, these optoelectronic probe cards can include embedded air-gap regions to enhance z-compliance of compliant leads when disposed substantially under a portion of each lead, permit the integration of micro-fluidic channels for thermal cooling, and/or provide electrical isolation between neighboring electrical interconnections, for example.

The optoelectronic probe cards of the present invention can find application in testing optoelectronic/microelectronic chips that include optical and electrical components. In particular, optoelectronic probe cards can be used to test fully-packaged wafers (end-of-line, after production) and wafers in-production (i.e., parametric testing during production). For example, optoelectronic probe cards can be used to test high-performance or cost-performance microprocessors, Application Specific Integrated Circuits (ASICs), System-on a-Chip (SoC) architectures that incorporate multiple technologies (such as RF, optical and MEMs structures), optoelectronic chips for telecommunications, or any other hybrid optoelectronic/microelectronic chips that include optical and electrical components.

Integration of passive optical interconnect components within the wafer-level probe card allows for a reduction in the number of optical sources required per test site through the facilitation of an optical fanout from each source. In this manner, multiple sites requiring optical excitation can be reached from a single device. Testing of fully packaged wafer-level optical interconnection where off-chip sources are to be used requires the replication of optical excitation conditions associated with board- or substrate-level passive components. An optical beam that is produced by a probe card-level source and passed through probe card-level coupling elements before impinging on wafer-level coupling elements under test, for example, can provide an electromagnetic field profile more representative of that encountered in the final board-to-chip coupling scenario. Accurate replication during test of the electromagnetic field profile encountered during product usage allows for optimum prediction of optical interconnect performance.

Embodiments of the optoelectronic probe card are well suited for a testing scenario where the optoelectronic/microelectronic chip to be tested is fed by off-chip optical sources. This scenario is expected during preliminary phases of optical interconnect technology integration, as the explicit need for incorporating a chip-level source (and hence III-V compound semiconductor technology integration) through monolithic or hybrid integration techniques is eliminated, thus simplifying process technology and associated costs. In addition, parametric testing of optoelectronic chips during wafer manufacture requires the use of off-chip detectors or emitters for reception or generation, respectively, of optical signals to ensure device reliability. Further, embodiments of the optoelectronic probe card can be used to test intra-chip optical clock distributions within gigascale microprocessors that involve the use of off chip optical sources, for example.

Now having described optoelectronic probe cards in general, examples 1 and 2 will describe some embodiments of the optoelectronic probe card. While embodiments of the optoelectronic probe card are described in connection with examples 1 and 2 and the corresponding text and figures, there is no intent to limit embodiments of the optoelectronic probe card to these descriptions. On the contrary, the intent is to cover all alternatives, modifications, and equivalents included within the spirit and scope of embodiments of the present invention.

EXAMPLE 1

Figure 1A:
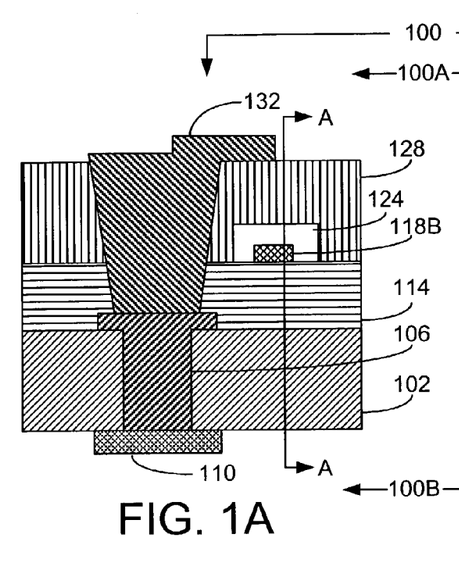
FIGS. 1A and 1B are schematics that illustrate two cross-sectional views of a representative optoelectronic probe card.
Figure 1B:
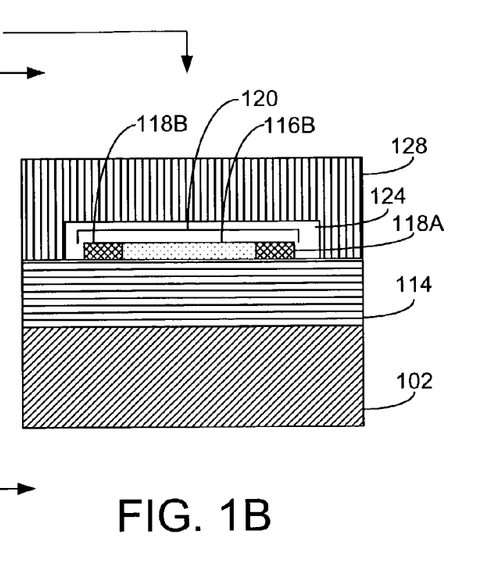

FIG. 1A is a schematic that illustrates a cross-sectional view of a representative optoelectronic probe card 100, while FIG. 1B is a schematic that illustrates the cross-sectional view of the optoelectronic probe card 100 with respect to the A-A arrows shown in FIG. 1A The optoelectronic probe card 100 includes a substrate 102, a backside die pad 106, a front side pad 110, a lower cladding layer 114, a waveguide 120 (i.e., a waveguide core 116B and two coupling elements 118A and 118B), an air-gap cladding layer 124, an overcoat layer 128, and a lead 132. The front side die pad 110 is disposed on the front side 100B of the substrate 102 and engages the backside die pad 106 on the backside 100A of the substrate 102. The backside die pad extends through a via in the substrate 102. The lower cladding layer 114 is disposed on the substrate 102 and the backside die pad 106. The waveguide 120 is disposed on a portion of the lower cladding layer 114. The air-gap cladding layer 124 substantially surrounds the waveguide 120. The overcoat layer 128 is disposed on the air-gap cladding layer 124 and the lower cladding layer 114. The lead 132 is disposed on the backside die pad 106, the lower cladding 114, and the overcoat layer 128. Additional details regarding the spatial relationship of the components of the optoelectronic probe card 100 depicted in FIGS. 1A and 1B are discussed in FIGS. 2A through 2N, which illustrate an exemplary fabrication process of the optoelectronic probe card 100.

The substrate 102 can be any of a variety of substrates that can be used to support the optoelectronic probe card 100. The substrate 102 can include materials such as, for example but not limited to, silicon, silicon compounds, germanium, germanium compounds, gallium, gallium compounds, indium, indium compounds, or other semiconductor materials/compounds. In addition, the substrate 102 can include non-semiconductor substrate materials, such as ceramics and organic boards, for example.

The lower cladding layer 114 can be any of a variety of materials that have a lower index of refraction than the waveguide core 116B. The lower cladding layer 114 can include organic and inorganic materials, such as silicon dioxide, silicon nitride, polyarylenes, ethers, parylenes, polynorbornenes, polyimides, epoxies, or other polymer materials, or porous low-k dielectrics, or semiconductor or other crystalline materials.

The lower cladding layer 114 can be deposited using any suitable technique such as, for example, spin coating, doctor-blading, sputtering, lamination, screen or stencil-printing, chemical vapor deposition (CVD), or through plasma based deposition systems.

The overcoat layer 128 can be any modular polymer that includes the characteristic of being permeable or semi-permeable to the decomposition gases produced by the decomposition of the sacrificial layer while forming the air-gap cladding layer 124. In addition, the overcoat layer 128 has elastic properties so as to not rupture or collapse under fabrication and use conditions. Further, the overcoat layer 128 is stable in the temperature range in which the sacrificial layer decomposes. Examples of the overcoat layer 128 include organic materials such as, for example, polyimides, polynorborenes, epoxies, polyarylenes, ethers, and parylenes, or inorganic materials such as silicon, silicon dioxide, or silicon nitride, for example.

The overcoat layer 128 can be deposited using any suitable technique such as, for example, spin coating, doctor-blading, sputtering, lamination, screen or stencil-printing, chemical vapor deposition (CVD), or through plasma based deposition systems.

The backside die pad 106 and the front side die pad 110 can be made of material such as, but not limited to, copper, titanium, or a combination thereof. The backside die pad 106 and the front side die pad 110 can be deposited upon the substrate 102 or a seed layer (not shown) on portions of the surface of the substrate using techniques such as, for example, sputtering, evaporation, electron-beam systems, electroplating, electro-less plating, and displacement reactions.

The waveguide 120 includes a waveguide core 116B having two coupling elements 118A and 118B disposed at each end of the waveguide core 120. In this manner, optical energy (e.g., light) can enter one coupling element 118A, travel down the waveguide core 116B, and exit the other coupling element 118B.

The waveguide core 116B functions as a medium for optical energy to travel through. Therefore, the waveguide 120 can communicate optical energy through the optoelectronic probe card 100.

The waveguide core 116B can be fabricated from materials such as, for example, polynorbornenes, polyimides, epoxies, or other polymer materials, low-k dielectric materials such as silicon dioxide, silicon nitride, or porous low-k dielectrics, or semiconductor or other crystalline materials.

In general, any material that exhibits a) transparency to a particular optical wavelength of light, b) process compatibility with other materials such that a contrast in refractive index is achieved, c) process compatibility with standard microelectronic fabrication processes, d) suitable mechanical strength, flexibility, and durability, and e) sufficient lifetime and/or reliability characteristics can serve as a waveguide material. A reference describing polymer materials suitable for optical waveguide applications can be found in A. R. Blythe and J. R. Vinson, *Proc. 5$^{th}$ International Symposium on Polymers for Advanced Technologies*. Tokyo, Japan: pp. 601-11, August-December 2000, which is incorporated herein by reference.

The waveguide 120 can be defined through multiple fabrication processes such as, but not limited to, photo-definition, wet chemical etching, dry plasma etching, thermally-induced refractive index gradients, and ion implantation. In addition, the waveguide 120 can have geometries such as, for example, raised strip geometry, buried geometry, and rib geometry.

The coupling elements 118A and 118B can include planar (or volume) grating couplers, evanescent couplers, surface-relief grating couplers, and total internal reflection couplers, for example. More specifically, when the coupling elements 118A and 118B are volume grating couplers, the coupling material can be laminated or spin-coated onto the appropriate surface. In particular, laminated volume grating couplers can be formed by holographic exposure of the grating region following lamination of the grating material. Alternatively, the laminated volume grating couplers can be formed by holographic exposure prior to lamination of the grating material. In another embodiment, the coupling elements can be disposed above and/or below the waveguide core 116B. In the case where the grating is to be formed inside of the waveguide, the waveguide core and grating regions can be composed of separate materials with near-identical indices of refraction and other material properties and processing conditions. Additional details regarding grating couplers can be found in U.S. Pat. No. 6,285,813, which is herein incorporated by reference.

The presence of coupling elements 118A and 118B, however, are not a requirement for some embodiments of the present invention, as simple butt-coupling of optical power both into and out of waveguide core 116B can also be performed.

If the coupling elements are grating couplers then the grating coupler material includes materials such as, for example, polymer materials, silver halide photographic emulsions, photoresists such as dichromated gelatin, photopolymers such as polymethyl methacrylate (PMMA) or Dupont HRF photopolymer films, for example, thermoplastic materials, photochromic materials such as crystals, glasses or organic substrates, photodichroic materials, and photorefractive crystals such as lithium niobate, for example. These materials have the characteristics of creating a refractive index modulation through a variety of mechanisms, all of which result in the creation of a phase or absorption or mixed grating. Other suitable materials are described in T. K. Gaylord and M. G. Moharam, *Proc. IEEE*, vol. 73, pp. 894-937, May 1985, which is herein incorporated by reference.

As depicted in FIGS. 1A and 1B, the optoelectronic probe card 100 includes an air-gap cladding layer 124 surrounding a portion of the waveguide 120 (i.e., waveguide core 116B and coupling elements 118A and 118B). The air-gap cladding layer 124 has a lower index of refraction (e.g., index of refraction of 1) than the waveguide core 116B. In alternative embodiments, other types of cladding layers (e.g., dielectric cladding composed of silicon dioxide, silicon nitride, polyarylenes, ethers, parylenes, polynorbornenes, polyimides, epoxies, or other polymer materials, or porous low-k dielectrics, or semiconductor or other crystalline materials, for example) can be used to surround (i.e., top, sides, bottom, and ends) the waveguide core 1161B and coupling elements 118A and 1181B, so long as the refractive index of the cladding material is lower than that of the core material.

Figure 2A:
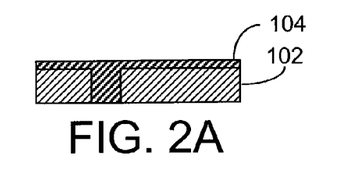
FIGS. 2A through 2N are cross-sectional views of a representative fabrication process of the optoelectronic probe card relative to the view illustrated in FIG. 1A.
Figure 2B:
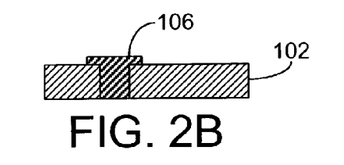
Figure 2C:
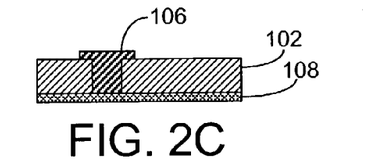
Figure 2D:
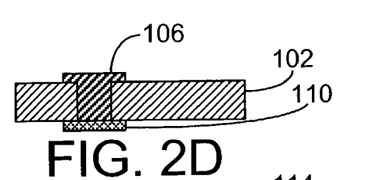
Figure 2E:
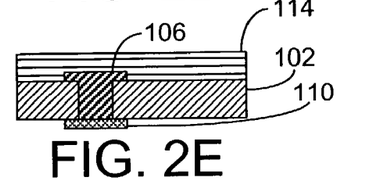
Figure 2F:
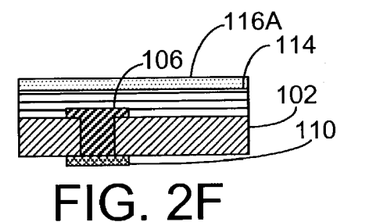
Figure 2G:
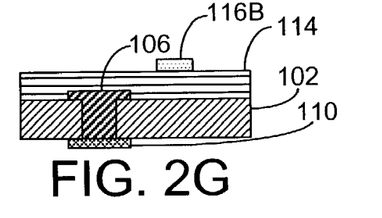
Figure 2H:
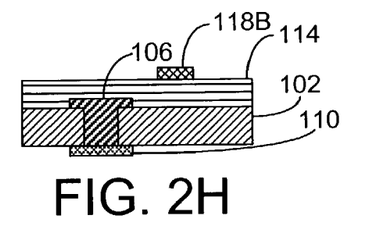
Figure 2I:
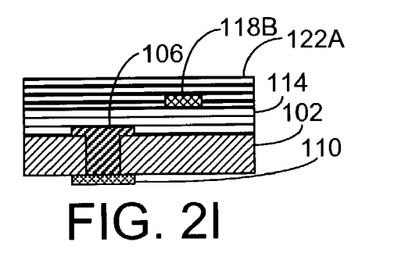
Figure 2J:
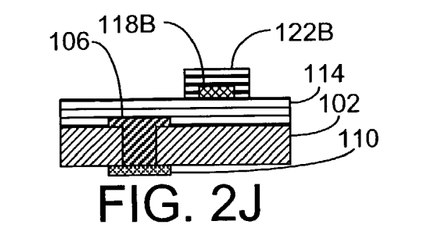
Figure 2K:
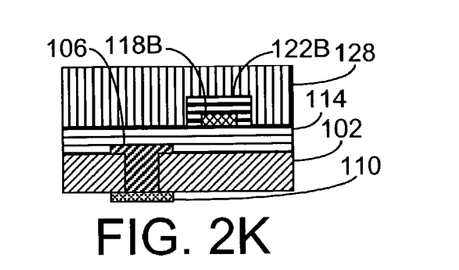
Figure 2L:
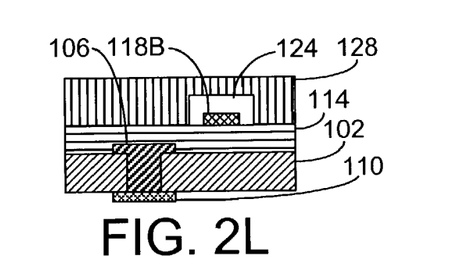
Figure 2M:
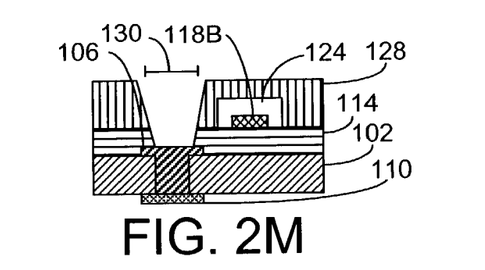
Figure 2N:
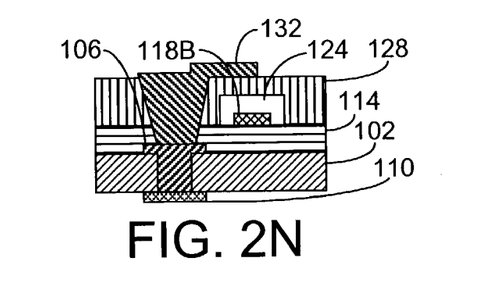

The air-gap cladding layer 124 can be formed by the removal (e.g., decomposition) of a sacrificial layer (as shown in FIGS. 2A through 2N and depicted as sacrificial layer 122) from the area in which the air-gap cladding layer 124 is to be located, as illustrated in FIGS. 1A and 1B. The air-gap cladding layer 124 occupies a space bounded by the lower cladding layer 114, the waveguide core 1161B, the coupling elements 118A and 1181B, and the overcoat layer 128.

Generally, during the fabrication process of the optoelectronic probe card 100, a sacrificial layer (illustrated in FIGS. 2A through 2N) is deposited onto the lower cladding layer 114, the waveguide core 116B, and the coupling elements 118A and 118B and patterned. Thereafter, the overcoat layer 128 is deposited around the sacrificial layer and on the lower cladding layer 114. Subsequently, the sacrificial layer is removed forming the air-gap cladding layer 124. The processes for depositing and removing the sacrificial layer are discussed in more detail hereinafter.

The sacrificial layer can be a polymer that slowly decomposes at a known temperature without leaving undesirable residue. The polymer should have a rate of decomposition so as to not create too great of a pressure while forming the air-gap cladding layer 124. In addition, the decomposition of the sacrificial layer produces gas molecules small enough to permeate the overcoat layer 128. Further, the sacrificial layer has a decomposition temperature less than the decomposition or degradation temperature of the overcoat layer 128.

Examples of compounds that can be used to form the sacrificial layer include polynorbornenes, polyformaldehyde, polycarbonates, polyethers, and polyesters. More specifically, the compounds of the preferred embodiments are Promerus L. L. C. Unity™ 400, polypropylene carbonate, polyethylene carbonate, polynorborene carbonate, or combinations thereof. The sacrificial layer may also be constructed of photosensitive compounds, which are additives for patterning or decomposition.

The sacrificial layer can be deposited using any suitable technique, for example, but not limited to, spin coating, doctor-blading, spray-coating, sputtering, lamination, screen or stencil-printing, melt dispensing, CVD, and plasma based deposition systems.

The height of the air-gap cladding layer 124 can range from about 0.5 to about 300 micrometers, preferably in the range of about 1 to about 15 micrometers. The radius of the air-gap cladding layer 124 can range from about 1 to about 300 micrometers, and more particularly can range from about 50 to about 250 micrometers. In general, the height of the air-gap cladding layer 124 is controlled by both the weight fraction of the sacrificial polymer in solution as well as the deposition technique.

The sacrificial layer can be removed by thermal decomposition, ultra violet irradiation, for example, or patterned directly during application, (i.e. screen-printing or selective etching). The thermal decomposition of the sacrificial layer can be performed by heating optoelectronic probe card 100 to the decomposition temperature of the sacrificial layer and holding at that temperature for a certain time period (e.g., 1-4 hours). Thereafter, the decomposition products diffuse through the overcoat layer 128 leaving a virtually residue-free hollow structure (air-gap cladding layer 124).

In another embodiment, the sacrificial polymer can be replaced with a cladding layer with a refractive index >1 but less than the refractive index of the core layer, which is not removed and bounds the waveguide on the top, sides and ends. The cladding layer can include materials like those discussed in reference to the lower cladding layer 114.

The overcoat layer 128 can be a modular polymer that includes the characteristic of being permeable or semi-permeable to the decomposition gases produced by the decomposition of the sacrificial layer while forming the air-gap cladding layer 124. In addition, the overcoat layer 128 has elastic properties so as to not rupture or collapse under fabrication and use conditions. Further, the overcoat layer 128 is stable in the temperature range in which the sacrificial layer decomposes. Furthermore, the overcoat layer 128 enables the lead 132 to be compliant in-plane (i.e., the x-y axis direction) when the lead 132 is adhered to the polymer surface.

Examples of the overcoat layer 128 include compounds such as, for example, silicon dioxide, silicon nitride, polyimides, polynorbornenes, epoxides, polyarylenes ethers, and parylenes. More specifically, the overcoat layer 128 of the preferred embodiment is Amoco Ultradel™ 7501, BF Goodrich Avatrel™ Dielectric Polymer, DuPont™ 2611, DuPont™ 2734, DuPont™ 2771, DuPont™ 2555, or combinations thereof, which are all commercially available.

The overcoat layer 128 can be deposited using any suitable technique, for example, spin coating, doctor-blading, sputtering, lamination, screen or stencil-printing, CVD, or through the use of plasma based deposition systems.

The lead 132 can be fabricated of any single layer or layers of different metals, metal composites, dielectrics, superconductors, or organic conductors, for example, appropriate for optoelectronic probe card 100. The metals and metal composites include gold, gold alloys, copper, copper alloys, and combinations thereof. The lead 132 can be fabricated by monolithically electroplating the selected metal or metal composite onto the compliant wafer device, for example.

The number of leads can range from about 10 to about 1,000,000 leads per centimeter squared ($cm^2$), about 1,000 to about 100,000 leads per $cm^2$, and preferable from about 1,000 to about 30,000 leads per $cm^2$ of the optoelectronic probe card 100. The number of leads in the preferred embodiment can range from about 10,000 to about 15,000 leads per $cm^2$ of the optoelectronic probe card 100.

The lead 132 can range from about 1 to about 100 micrometers in thickness and preferably from about 4 to about 40 micrometers. The preferred embodiment has a thickness of about 15 micrometers. The lead 132 length can range from about 2 and about 400 micrometers, preferably from about 40 to about 120 micrometers. The lead 132 width can range from about 1 to about 100 micrometers, preferably from about 2 to about 40 micrometers. The preferred embodiment has a width in the range of about 15 to about 25 micrometers.

The lead 132 can be compliant in-plane and out-of-plane. The portion of the lead positioned above the overcoat layer 150 provides compliance in-plane. The lead 132 is compliant in-plane in the range of about 1 to about 100 micrometers, preferably from about 1 to about 50 micrometers.

Optionally, a contact (not shown) can be disposed on the lead 132, which can include a variety of contacts designed to make contact or attach to a pad or point on another device such as a microelectronic device, for example. The contact can be, for example, a solder bump, a conductive adhesive or filled polymer, or a contact probe. The contact 132 can be formed with methods such as electroplating, electroless plating, screen or stencil printing.

Although only one waveguide 120 is depicted in FIGS. 1A and 1B, one or more waveguides can be included in each air-gap channel of the optoelectronic probe card 100. In addition, one or more waveguide cores/couplers can be included in the air-gap cladding layer 124. Further, the optoelectronic probe card 100 can also have multiple layers of waveguides. Furthermore, the waveguide and the air-gap cladding layer do not have to be disposed on the lower cladding layer 114. In that regard, the waveguide and the air-gap cladding layer can be disposed within an overcoat layer having a lower index of refraction than the waveguide.

For the purposes of illustration only, the optoelectronic probe card 100 of the present invention is described with particular reference to the below-described fabrication method. The fabrication method is described from the point of view shown in FIG. 1A. The fabrication method is not shown from the point of view of FIG. 1B. One skilled in the art would understand how the fabrication process would proceed based upon FIGS. 1A and 1B, and 2A through 2N and the associated discussion.

For clarity, some portions of the fabrication process are not included in FIGS. 2A through 2N. For example, photolithography or similar techniques can be used to define the overcoat layer 128, the sacrificial layer, the waveguide 120, and/or the lead 132 pattern. In this regard, the pattern can be defined by depositing material onto the surface of the substrate 102, lower cladding layer 114, etc. using techniques such as, for example, sputtering, CVD, plasma based deposition systems, evaporation, and electron-beam systems. Furthermore, the pattern can then be removed using reactive ion etching techniques (RIE), for example.

The following fabrication process is not intended to be an exhaustive list that includes every step required for fabricating the optoelectronic probe card 100. In addition, the fabrication process is flexible because the process steps may be performed in a different order than the order illustrated in FIGS. 2A through 2N.

FIGS. 2A through 2N are cross-sectional views of the fabrication process relative to the view illustrated in FIG. 1A. FIG. 2A illustrates a backside die pad layer 104 disposed on the substrate 102. FIG. 2B illustrates the formation of the backside die pad 106 disposed on the backside of the substrate 102. The backside die pad layer 106 can be etched using techniques such as, but not limited to, wet chemical etching or dry plasma etching.

FIG. 2C illustrates the front side die pad layer 108 disposed on the front side of the substrate 102. FIG. 2D illustrates the formation of the front side die pad 110 disposed on the front side of the substrate 102 (labeled as 110 in FIG. 2D). The front side die pad layer 108 can be etched using techniques such as, but not limited to, wet chemical etching or dry plasma etching.

FIG. 2E illustrates the lower cladding layer 114 disposed on the backside die pad 106 and substrate 102. The lower cladding layer 114 can be disposed on the backside die pad 106 and substrate 102 using techniques such as, but not limited to, spin coating, doctor-blading, sputtering, lamination, screen and stencil-printing, CVD, or through plasma based deposition systems.

FIG. 2F illustrates the waveguide core layer 116A disposed on a portion of the lower cladding layer 114. FIG. 2G illustrates the waveguide core layer 116A after definition into waveguide channel 116B using techniques such as, but not limited to, photodefinition, wet chemical etching, or dry plasma etching.

FIG. 2H illustrates the defining of the waveguide core layer 116A into coupling elements 118A and 118B. Alternatively, a coupling material can be disposed adjacent the waveguide core 116B and converted into coupling elements 118A and 118B as described in the patent application having Ser. No. 10/074,420 and entitled "Guided-Wave Optical Interconnections Embedded within a Microelectronic Wafer-Level Batch Package", which is entirely incorporated herein by reference.

FIG. 2I illustrates the sacrificial layer 122A disposed over the lower cladding layer 114, waveguide core 116B, and the coupling elements 118A and 118B. FIG. 2J illustrates the channel definition of sacrificial layer section 122B. The sacrificial layer section 122B can be defined by etching or UV exposure/thermal decomposition of the sacrificial layer 122A, for example. The sacrificial layer section 122B defines the area where the air-gap cladding layer 124 will subsequently be located once the sacrificial layer section 122B is removed. Alternatively, the sacrificial layer section 122B does not have to be removed if the sacrificial layer section 122B is an appropriate cladding material as discussed above.

FIG. 2K illustrates the overcoat layer 128 disposed on the lower cladding layer 114 and the sacrificial layer section 122B. FIG. 2L illustrates the removal of the sacrificial layer section 122B to form the air-gap cladding layer 124 of the waveguide 120. In this embodiment, the waveguide 120 includes the lower cladding layer 114, the waveguide core 1161B, the coupling elements 118A and 1181B, and the air-gap cladding layer 124 (upper and side cladding).

FIG. 2M illustrates the formation of a via 130 in the overcoat layer 128 and the lower cladding layer 114, and exposing a portion of the backside die pad 106. FIG. 2N illustrates the formation of the lead 132 disposed upon the backside die pad 106 and overcoat layer 128. A portion of the lead 132 is disposed over a portion of the air-gap cladding layer 124. Alternatively, the sacrificial layer section 146 could be removed at this point in the fabrication rather than in the previous step.

EXAMPLE 2

Figure 3A:
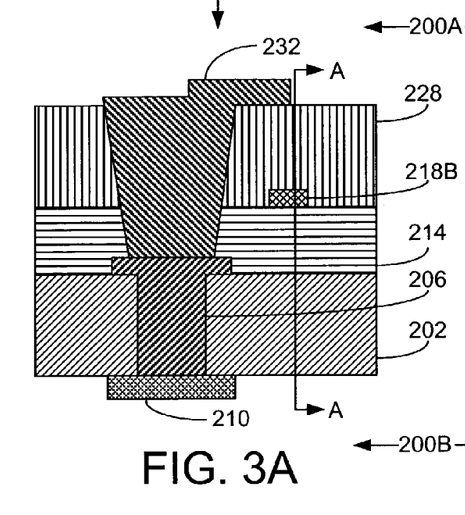
FIGS. 3A and 3B are schematics that illustrate two cross-sectional views of another representative optoelectronic probe card.
Figure 3B:
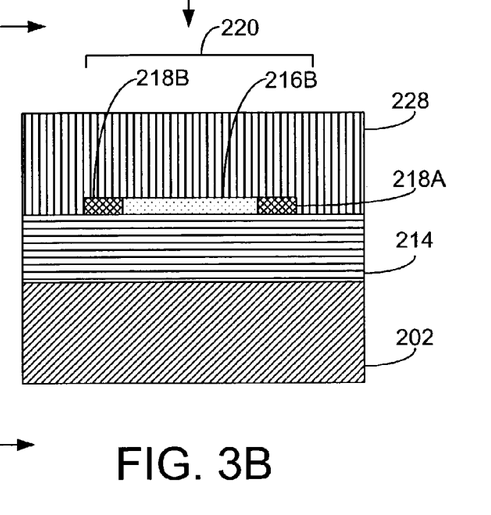

FIG. 3A is a schematic that illustrates a cross-sectional view of another representative optoelectronic probe card 200, while FIG. 3B is a schematic that illustrates the cross-sectional view of the optoelectronic probe card 200 with respect to the A-A arrows shown in FIG. 3A

The optoelectronic probe card 200 includes a substrate 202, a backside die pad 206, a front side pad 210, a lower cladding layer 214, a waveguide 220 (i.e., a waveguide core 216B and two coupling elements 218A and 218B), an overcoat layer 228, and a lead 232. The front side die pad 210 is disposed on the front side 200B of the substrate 202 and engages the backside die pad 206 on the backside 200A of the substrate 202. The backside die pad 206 extends through a via in the substrate 202. The lower cladding layer 224 is disposed on the substrate 202 and the backside die pad 206. The waveguide 220 is disposed on a portion of the lower cladding layer 214. The overcoat layer 228 is disposed on the waveguide 220 and the lower cladding layer 214. The lead 232 is disposed on the backside die pad 206, the lower cladding 214, and the overcoat layer 228. Additional details regarding the spatial relationship of the components of the optoelectronic probe card 200 depicted in FIGS. 3A and 3B are discussed in FIGS. 4A through 4K, which illustrate an exemplary fabrication process of the optoelectronic probe card 200.

The substrate 202 can be any of a variety of substrates that can be used to support the optoelectronic probe card 200 and is similar to the substrate 102 discussed in reference to FIGS. 1A and 1B. Similarly, the lower cladding layer 214 can be any of a variety of materials that have a lower index of refraction than the waveguide core 216B and is similar to the lower cladding layer 114 discussed in reference to FIGS. 1A and 1B. Furthermore, the backside die pad 206 and the front side die pad 210 are similar to the backside die pad 106 and the front side die pad 110 discussed in reference to FIGS. 1A and 1B. Therefore, additional discussion of the substrate 202, the lower cladding layer 214, the backside die pad 206, and the front side die pad 210 will not be discussed in detail here, and the reader should refer to the discussion above for more information concerning these components and construction of these components.

The waveguide 220 includes a waveguide core 216B having two coupling elements 218A and 218B disposed at each end of the waveguide core 220. The waveguide 220, the waveguide core 216B, and the coupling elements 218A and 218B are similar to waveguide 120, the waveguide core 1161B, and the coupling elements 118A and 1181B described in reference to FIGS. 1A and 1B. Therefore, additional discussion of the waveguide 220, the waveguide core 216B, and the coupling elements 218A and 218B will not be discussed in detail here, and the reader should refer to the discussion above for more information concerning these components and the construction of these components.

The overcoat layer 228 is similar to the overcoat layer 128 discussed in reference to FIGS. 1A and 1B. Therefore, additional discussion of the overcoat layer 228 will not be discussed in detail here, and the reader should refer to the discussion above for more information concerning the overcoat layer 228 and the construction of this layer. However, it should be noted that the overcoat layer 228 for the optoelectronic probe card 200 acts as a cladding layer for the waveguide 220. Thus, the overcoat layer 228 can be made of materials having a lower index of refraction than the waveguide core 216B as discussed above for the lower cladding layer 114 in reference to FIGS. 1A and 11B.

The lead 232 is similar to the lead 132 discussed in reference to FIGS. 1A and 1B. Therefore, additional discussion of the lead 232 will not be discussed in detail here, and the reader should refer to the discussion above for more information concerning the lead 232 and the construction of the lead.

Optionally, a contact (not shown) can be disposed on the lead 232, which can include a variety of contacts designed to make contact or attach to a pad or point on another device such as a microelectronic device, for example. The contact can be, for example, a solder bump, a conductive adhesive or filled polymer, or a contact probe. The contact can be formed with methods such as electroplating, electroless plating, screen or stencil printing.

Although only one waveguide 220 is depicted in FIGS. 3A and 3B, one or more waveguides can be included in each air-gap channel of the optoelectronic probe card 200. In addition, one or more waveguide cores/couplers can be included in the waveguide 220. Further, multiple layers of waveguides can also be included in the optoelectronic probe card 200.

For the purposes of illustration only, the optoelectronic probe card 200 of the present invention is described with particular reference to the below-described fabrication method. The fabrication method is described from the point of view shown in FIG. 3A. The fabrication method is not shown from the point of view of FIG. 3B. One skilled in the art would understand the fabrication process based upon FIGS. 3A and 3B, and 4A through 4K and the associated discussion.

For clarity, some portions of the fabrication process are not included in FIGS. 4A through 4K. For example, photolithography or similar techniques can be used to define the overcoat layer 228, the waveguide 220, and/or the lead 232 pattern. In this regard, the pattern can be defined by depositing material onto the surface of the substrate 202, lower cladding layer 214, etc. using techniques such as, for example, sputtering, CVD, plasma based deposition systems, evaporation, and electron-beam systems. Furthermore, the pattern can then be removed using reactive ion etching techniques (RIE), for example.

The following fabrication process is not intended to be an exhaustive list that includes every step required for fabricating the optoelectronic probe card 200. In addition, the fabrication process is flexible because the process steps may be performed in a different order than the order illustrated in FIGS. 4A through 4K.

Figure 4A:
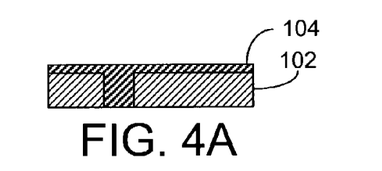
FIGS. 4A through 4K are cross-sectional views of a representative fabrication process of the optoelectronic probe card relative to the view illustrated in FIG. 3A.

FIGS. 4A through 4K are cross-sectional views of the fabrication process relative to the view illustrated in FIG. 3A. FIG. 4A illustrates a backside die pad layer 204 disposed on the substrate 202.

Figure 4B:
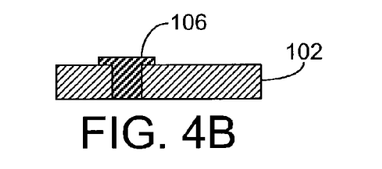

FIG. 4B illustrates the formation of the backside die pad 206 disposed on the backside of the substrate 202. The backside die pad layer 206 can be etched using techniques such as, but not limited to, wet chemical etching or dry plasma etching.

Figure 4C:
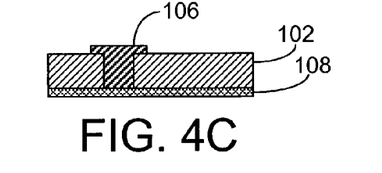
Figure 4D:
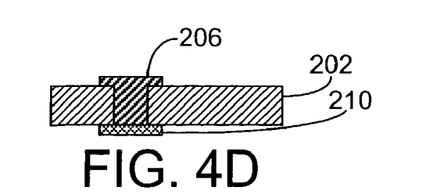

FIG. 4C illustrates the front side die pad layer 208 disposed on the front side of the substrate 202. FIG. 4D illustrates the formation of the front side die pad 210 disposed on the front side of the substrate 202. The front side die pad layer 208 can be etched using techniques such as, but not limited to, wet chemical etching or dry plasma etching.

Figure 4E:
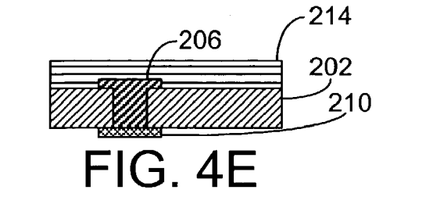

FIG. 4E illustrates the lower cladding layer 214 disposed on the backside die pad 206 and substrate 202. The lower cladding layer 214 can be disposed on the backside die pad 206 and substrate 202 using techniques such as, but not limited to, spin coating, doctor-blading, sputtering, lamination, screen and stencil-printing, CVD, or through plasma based deposition systems.

Figure 4F:
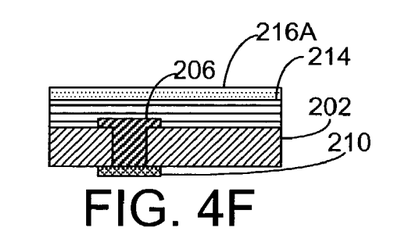
Figure 4G:
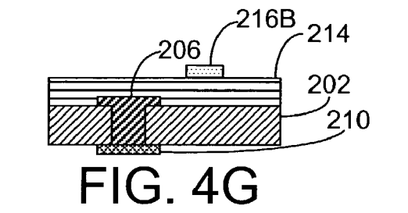

FIG. 4F illustrates the waveguide core layer 216A disposed on a portion of the lower cladding layer 214. FIG. 4G illustrates the waveguide core layer 216A after definition into waveguide channel 216B using techniques such as, but not limited to, photodefinition, wet chemical etching, or dry plasma etching.

Figure 4H:
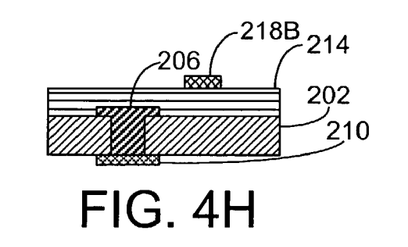

FIG. 4H illustrates the defining of the waveguide core layer 216A into coupling elements 218A and 218B. Alternatively, a coupling material can be disposed adjacent the waveguide core 216B and converted into coupling elements 218A and 218B.

Figure 4I:
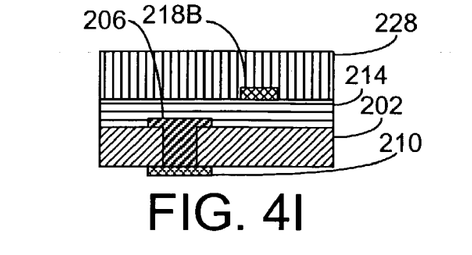

FIG. 4I illustrates the overcoat layer 228 disposed on the lower cladding layer 214 and the waveguide core layer 216A and coupling elements 218A and 218B. In this embodiment, the waveguide 220 includes the lower cladding layer 214, the waveguide core 216B, the coupling elements 218A and 218B, and the overcoat layer 228 (upper and side cladding).

Figure 4J:
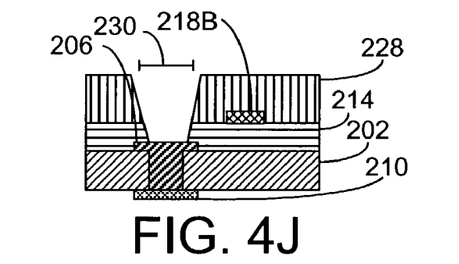
Figure 4K:
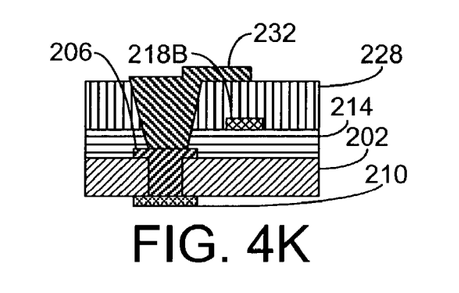

FIG. 4J illustrates the formation of a via 230 in the overcoat layer 228 and the lower cladding layer 214, and exposing a portion of the backside die pad 206. FIG. 4K illustrates the formation of the lead 232 disposed upon the backside die pad 206 and overcoat layer 228.

Exemplary Uses of Optoelectronic Probe Cards

Embodiments of the present invention also involve methods for testing a hybrid optoelectronic structure having electrical and optical interconnect components with optoelectronic probe cards. Optoelectronic probe cards can be used in a plurality of testing scenarios to test optoelectronic structures having electrical and/or optical passive components and/or optical active components. Briefly described, one exemplary method includes producing an optical signal in an optoelectronic probe card and coupling an optical signal from the optoelectronic probe card to an optoelectronic structure under test. Another embodiment of the method includes producing an optical signal in an optoelectronic structure under test and coupling the optical signal from the optoelectronic structure under test to an optoelectronic probe card. The following examples illustrate some of the scenarios in which the optoelectronic probe cards can be implemented. However, the following examples are not intended to limit the testing scenarios, but to only provide a number of illustrative examples for testing an optoelectronic structure using optoelectronic probe cards.

For example, an optoelectronic probe card can be used by coupling the optical signal originating from an optical source on the optoelectronic probe card directly to an active optoelectronic device in the optoelectronic structure under test. In another example, the signal from the optical source on the optoelectronic probe card can be coupled directly to a single-layer waveguide or multiple layers of waveguides in the optoelectronic structure under test, which can be coupled to an active optoelectronic component.

In another example, the optical signal originating from an optical source of the optoelectronic probe card can be coupled to a single-layer waveguide or multiple layers of waveguides in the optoelectronic probe card, which can be coupled to an active optoelectronic component of the optoelectronic structure under test. In still another example, the optical signal originating from the optical source of the optoelectronic probe card can be coupled to a single-layer waveguide or multiple layers of waveguides in the optoelectronic probe card, which can be coupled to an active optoelectronic component in the optoelectronic structure under test through a single-layer waveguide or multiple layers of waveguides in the optoelectronic structure under test.

In another example, the optical signal originating from the optoelectronic structure under test can be coupled to an active optoelectronic component located on the optoelectronic probe card. In another example, the optical signal originating from the optoelectronic structure under test can be coupled to a single-layer waveguide or multiple layers of waveguides on the optoelectronic probe card, which then can be coupled to an active optoelectronic component on the optoelectronic probe card. In still another example, the signal from the optoelectronic structure under test can be coupled directly to a single-layer waveguide or multiple layers of waveguides in the optoelectronic structure under test, which can be coupled to a probe card-level active optoelectronic component. In another example, the signal from the optoelectronic structure under test can be coupled directly to a single-layer waveguide or multiple layers of waveguides in the optoelectronic structure under test, which can be coupled to a probe card-level optoelectronic component through a probe card-level single-layer waveguide or multiple layers of waveguides.

In the examples above, the optoelectronic structure under test can include, but is not limited to, a single semiconductor die, multiple semiconductor die, a printed circuit board, multiple printed circuit boards, a multi-chip module, multiple multi-chip modules, and a ceramic substrate or multiple ceramic substrates. Further, the waveguide can include, but is not limited to, an optical fiber or an integrated optical waveguide. The waveguide can include coupling elements adjacent to or within the waveguide. Also, the waveguide can include an air-gap cladding region, as discussed herein.

The waveguides in either the optoelectronic structure under test or optoelectronic probe card can be routed horizontally across the face of the optoelectronic structure under test or optoelectronic probe card. The waveguides in either the optoelectronic structure under test or optoelectronic probe card can be routed vertically from the face of the optoelectronic structure under test or optoelectronic probe card. The waveguide core region of the waveguides in either the optoelectronic structure under test or optoelectronic probe card can include organic or inorganic material having a non-unity index of refraction, as described above. The waveguide cladding region of the waveguides in either the optoelectronic structure under test or optoelectronic probe card include organic or inorganic materials having an index of refraction $\geq 1$, as described above.

The waveguide cladding region of the waveguides in either the optoelectronic structure under test or optoelectronic probe card can also include an underfill material that meets the requirements of packaging underfill materials (provides a sufficient match in coefficient of thermal expansion with the solder materials along with compatible modulus, viscosity, glass transition temperature, underfill flow, shelf life, cure profile, adhesion, and moisture absorption characteristics) and is transparent to the wavelength of the optical signal. Finally, the waveguides in either the optoelectronic structure under test or optoelectronic probe card can include a single or multiple horizontal and/or vertical layer(s).

It should be emphasized that the above-described embodiments of the present invention are merely possible examples of implementations, merely set forth for a clear understanding of the principles of the invention. Many variations and modifications may be made to the above-described embodiments. For example, a plurality of air-gap layers can be included in the optoelectronic probe card. Further, an additional air-gap can be located between the lead and the overcoat layer. All such modifications and variations are intended to be included herein within the scope of this disclosure and protected by the following claims.

Therefore, having thus described the invention, at least the following is claimed:

1. A method for testing a hybrid optoelectronic chip having electronic and optical interconnect components comprising:
   producing an optical signal an optoelectronic probe card; and
   coupling the optical signal from the optoelectronic probe card to an optical component disposed in the hybrid optoelectronic chip, wherein the optoelectronic probe card and the hybrid optoelectronic chip are distinct and separate structures and are not part of the same structure.

2. The method of claim 1, wherein coupling further comprises:
   coupling the optical signal to an optical component.

3. The method of claim 2, wherein the optical component can be selected from a passive optical component and an active optical component.

4. The method of claim 2, wherein the optical component includes an optical component disposed in the optoelectronic probe card.

5. The method of claim 1, wherein coupling further comprises:
   coupling the optical signal to at least one waveguide.

6. The method of claim 5, wherein the at least one waveguide include a plurality of waveguides.

7. The method of claim 5, wherein the optical component can be selected from a passive optical component and an active optical component.

8. The method of claim 1, wherein coupling further comprises:
   coupling the optical signal to at least one waveguide; and
   coupling the optical signal to an optical component.

9. A method for testing a hybrid optoelectronic chip having electronic and optical interconnect components comprising:

producing an optical signal from an optical component disposed in the hybrid optoelectronic chip; and coupling the optical signal from the hybrid optoelectronic chip to an optoelectronic probe card, wherein the optoelectronic probe card and the hybrid optoelectronic chip are distinct and separate structures and are not part of the same structure.

10. The method of claim 9, wherein coupling further comprises:

coupling the optical signal to an optical component.

11. The method of claim 9, wherein the optical component can be selected from a passive optical component and an active optical component.

12. The method of claim 9, wherein the optical component includes an optical component disposed in the optoelectronic probe card.

13. The method of claim 9, wherein coupling further comprises:

coupling the optical signal to at least one waveguide.

14. The method of claim 13, wherein the at least one waveguide includes a waveguide disposed in the optoelectronic probe card.

15. The method of claim 13, wherein the at least one waveguide includes a plurality of waveguides.

16. The method of claim 13, wherein the optical component can be selected from a passive optical component and an active optical component.

17. The method of claim 9, wherein coupling further comprises:

coupling the optical signal to at least one waveguide; and
coupling the optical signal to an optical component.

18. A method for testing a hybrid optoelectronic structure having electronic and optical interconnect components comprising:

producing an optical signal in one of an optoelectronic probe card or the hybrid optoelectronic structure; and coupling the optical signal from one of the optoelectronic probe card or the hybrid optoelectronic structure to the other of the optoelectronic probe card or the hybrid optoelectronic structure, wherein the optoelectronic probe card and the hybrid optoelectronic structure are distinct and separate structures and are not part of the same structure, wherein the optical component includes an optical component disposed in the hybrid optoelectronic structure.

19. The method of claim 18, wherein coupling further comprises:

coupling the optical signal to an optical component.

20. The method of claim 19, wherein the optical component can be selected from a passive optical component and an active optical component.

21. The method of claim 19, wherein the optical component includes an optical component disposed in the optoelectronic probe card.

22. The method of claim 18, wherein coupling further comprises:

coupling the optical signal to at least one waveguide.

23. The method of claim 22, wherein the waveguide includes at least one waveguide disposed in the hybrid optoelectronic structure.

24. The method of claim 22, wherein the waveguide includes at least one waveguide disposed in the optoelectronic probe card.

25. The method of claim 22, wherein the at least one waveguide includes a first waveguide disposed in the hybrid optoelectronic structure and a second waveguide disposed in the optoelectronic probe card.

26. The method of claim 22, wherein the at least one waveguide includes a plurality of waveguides.

27. The method of claim 22, wherein the optical component can be selected from a passive optical component and an active optical component.

28. The method of claim 18, wherein coupling further comprises:

coupling the optical signal to at least one waveguide; and
coupling the optical signal to an optical component.

* * * * *

UNITED STATES PATENT AND TRADEMARK OFFICE
CERTIFICATE OF CORRECTION

PATENT NO. : 7,554,347 B2
APPLICATION NO. : 10/390873
DATED : June 30, 2009
INVENTOR(S) : Mule' et al.

It is certified that error appears in the above-identified patent and that said Letters Patent is hereby corrected as shown below:

Delete Sheet 3 of 4 with replacement Figs. 4A-4C.
Col. 8, line 63: Remove "132".
Col. 10, line 31: Remove "146" and replace with "122B".
Col. 10, line 50: Remove "224" and replace with "214".
Col. 11, line 34: Remove "11B" and replace with "1B".
Col. 14, line 58: Remove "include" and replace with "includes".

Signed and Sealed this

First Day of June, 2010

David J. Kappos
*Director of the United States Patent and Trademark Office*